(12) United States Patent
Sharma et al.

(10) Patent No.: US 8,545,945 B2
(45) Date of Patent: Oct. 1, 2013

(54) MICROPATTERN GENERATION WITH PULSED LASER DIFFRACTION

(75) Inventors: Ashutosh Sharma, Kanpur (IN); Ankur Verma, Rishikesh (IN); Giridhar U. Kulkarni, Bangalore (IN)

(73) Assignees: Indian Institute of Technology Kanpur, Uttar Pradesh (IN); Jawaharlal Nehru Centre for Advanced Scientific Research, Bangalore, Karnataka (IN)

( * ) Notice: Subject to any disclaimer, the term of this patent is extended or adjusted under 35 U.S.C. 154(b) by 0 days.

(21) Appl. No.: 13/359,798

(22) Filed: Jan. 27, 2012

(65) Prior Publication Data
US 2013/0196083 A1    Aug. 1, 2013

(51) Int. Cl.
*B05D 3/06* (2006.01)
*B05D 3/00* (2006.01)

(52) U.S. Cl.
USPC ............ 427/555; 427/554; 427/271; 427/331

(58) Field of Classification Search
None
See application file for complete search history.

(56) References Cited

U.S. PATENT DOCUMENTS

| | | | |
|---|---|---|---|
| 6,753,131 B1 * | 6/2004 | Rogers et al. | 430/322 |
| 2003/0152756 A1 * | 8/2003 | Yamada et al. | 428/210 |
| 2003/0175004 A1 * | 9/2003 | Garito et al. | 385/143 |
| 2006/0108327 A1 * | 5/2006 | Chng et al. | 216/94 |
| 2011/0058171 A1 * | 3/2011 | Yuasa et al. | 356/402 |

FOREIGN PATENT DOCUMENTS
WO    WO2010/104651 A1    9/2010

OTHER PUBLICATIONS

Falconnet et al., Surface engineering approaches to micropattern surfaces for cell-based assays, *Biomaterials* (Jun. 2006), 27(16):3044-3063 (Abstract).
Ji et al., Facile Approach to the Fabrication of a Micropattern Possessing Nanoscale Substructure, *Langmuir* (2007), 23(25):12663-12668 (Abstract).
Lee et al., Using femtosecond laser to fabricate highly precise interior three-dimensional microstructures in polymeric flow chip, *Biomicrofluidics* (Jul. 25, 2010), 4(4):046502-046506.
Li et al., Breath figure lithography: A facile and versatile method for micropatterning, *Journal of Colloid and Interface Science* (Feb. 1, 2010), 342(1):192-197 (Abstract).
Verma et al., Ultrafast Large Area Micropattern Generation in Nonabsorbing Polymer Thin-Films by Pulsed Laser Diffraction, *Small* (Feb. 2, 2011), 7(6):758-765.
VISTEC Lithography, http://nanomelbourne.com/flagship-equipment [printed from internet Jan. 10, 2012].

* cited by examiner

*Primary Examiner* — Timothy Meeks
*Assistant Examiner* — Ina Agaj
(74) *Attorney, Agent, or Firm* — Pepper Hamilton LLP

(57) ABSTRACT

Methods and devices for preparing microscale polymer relief structures from a thin polymer layer on an absorbing substrate are described. The described methods are ultrafast (about 8 nanoseconds) and allow formation of patterned microstructures having complex morphologies and narrow line widths that are an order of magnitude smaller than the masks used in the methods.

14 Claims, 9 Drawing Sheets

MICROPATTERN GENERATION WITH PULSED LASER DIFFRACTION

BACKGROUND

There are several known techniques for the generation of controlled micro-patterns based on self-organization of soft materials. For example, controlled dewetting of ultrathin (less than 100 nm) polymer films has been extensively studied as a tool for polymer patterning. The characteristic length scales (feature size and wavelength) of dewetting is strongly dependent on the initial thickness of the polymer layer. The time scales involved in the dewetting of polymer films are typically on the order of several minutes, and the structures can be aligned on the scale of the chemically patterned templates used as substrates for dewetting. A different strategy for polymer patterning involves the formation of surface relief structures in the form of wrinkling and buckling of polymer films under mechanical stresses generated during stretching/compression and differential swelling/shrinkage. The characteristic length scales of the wrinkling and buckling scales with layer thickness and stresses in the layer and substrate. Another widely studied technique for the patterning of laser-absorbing polymers and other hard materials like metals, glass, and ceramics is laser ablation. Depending on its absorption and interaction with the material, laser irradiation may cause material removal or modify it chemically or physically. However, a low absorption coefficient of some polymers, such as polystyrene and polymethylmethacrylate, can make pattern formation by laser ablation difficult unless modifications are made to enhance the optical absorption of these polymers.

SUMMARY

This disclosure is not limited to the particular systems, devices and methods described, as these may vary. The terminology used in the description is for the purpose of describing the particular versions or embodiments only, and is not intended to limit the scope. While various compositions and methods are described in terms of "comprising" various components or steps (interpreted as meaning "including, but not limited to"), the compositions and methods can also "consist essentially of" or "consist of" the various components and steps, and such terminology should be interpreted as defining essentially closed-member groups.

Embodiments describe methods and devices for preparing microscale polymer relief structures from a thin polymer layer on an absorbing substrate. Localized heating of the substrate by absorption of diffracted electromagnetic radiation and subsequent reorganization of the polymer layer may allow the polymer to self-organize into patterned periodic relief structures. Use of a pulsed laser may allow these methods to be ultrafast and suitable for continuous fabrication, while remaining simple, flexible, and direct.

In various embodiments, a method for preparing microscale polymer relief structures includes providing a substrate coated with at least one polymer layer, exposing the substrate and the at least one polymer layer to electromagnetic radiation, producing heat from the energy absorbed by the substrate, and reorganizing the polymer layer with the produced heat to prepare microscale polymer relief structures.

In various embodiments, a device for preparing periodic microscale polymer relief structures includes a source of electromagnetic radiation, a periodic aperture, and a stage configured to allow a substrate positioned on the stage to be irradiated by electromagnetic radiation.

DETAILED DESCRIPTION

Figure 1:
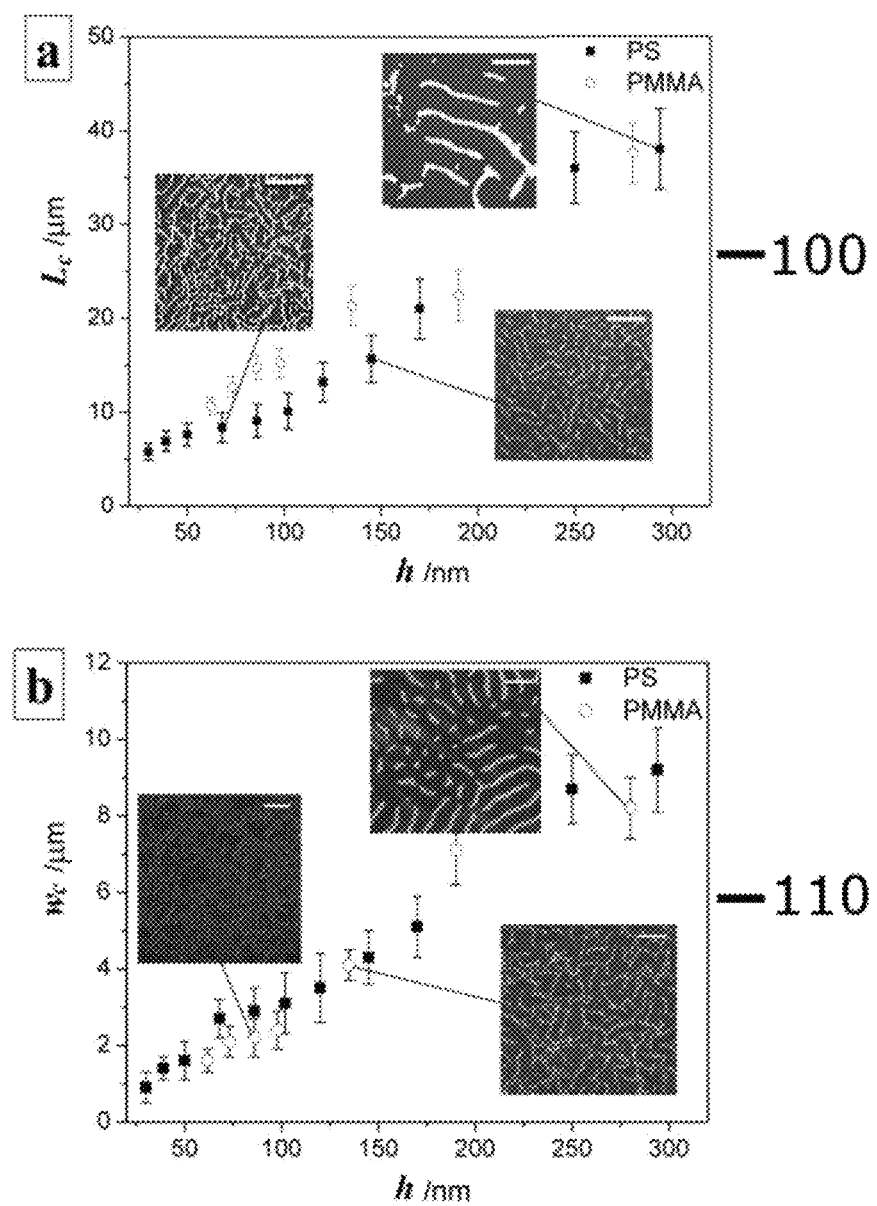
FIG. 1 provides exemplary microscopy images and plots showing the dependence of characteristic length-scales of the pattern on the polymer layer thickness in accordance with an embodiment. (a) Mean separation of ridges, ($L_C$) as a function of layer thickness (h). Insets show optical micrographs of the ridges resulting from polymer films with thicknesses 68 nm, 145 nm and 294 nm, respectively. (b) Ridge width ($w_C$) as a function of layer thickness (h). Insets show optical micrographs of the ridges resulting from polymer films with thicknesses 86 nm, 135 nm and 280 nm, respectively (Scale bars: 50 μm).
Figure 2:
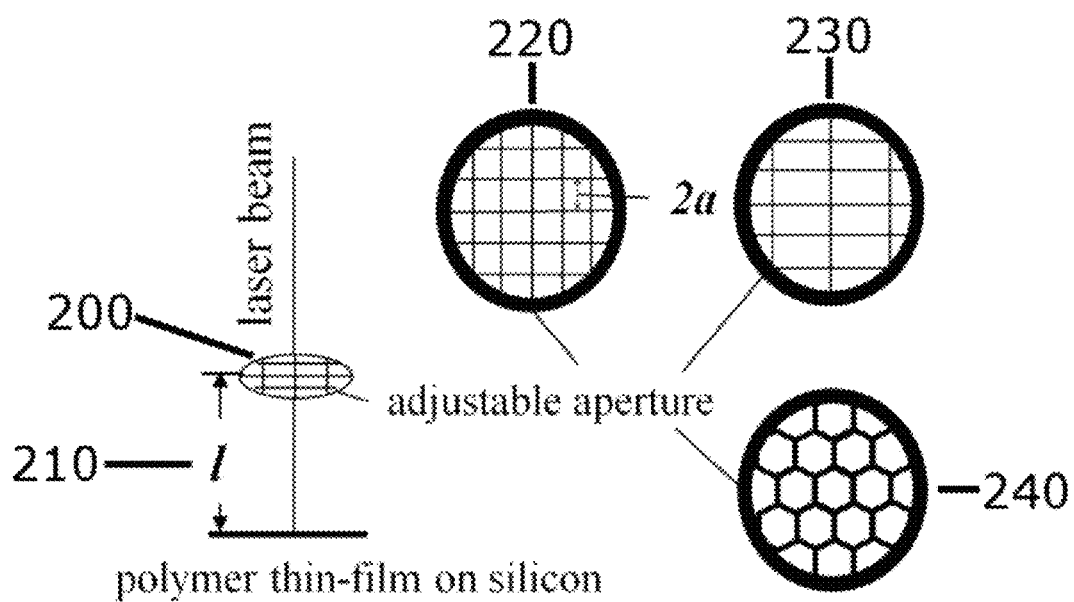
FIG. 2 is a schematic diagram of an exemplary experimental setup, in accordance with an embodiment.

Methods and devices for preparing microscale polymer relief structures from a thin polymer (less than or equal to about 500 nm) layer on an absorbing substrate are described herein. In general, the polymer relief structures are formed by heating a substrate irradiating with electromagnetic radiation. The substrate may absorb the electromagnetic radiation which allows reorganization of the polymer layer into self-organize into relief structures. In some embodiments, line widths of the relief structures may be tuned by adjusting the thickness of the polymer layer. In some embodiments, the electromagnetic radiation may be passed through a periodic aperture which may cause localized reorganization of the polymer layer allowing relief structures to form periodic patterns, and in certain embodiments, individual units of the periodic pattern may be more than an order of magnitude smaller than the openings of the periodic aperture. The periodic patterns obtained by passing the electromagnetic energy through a periodic aperture may more structurally complex than the openings in the periodic apertures allowing "beyond-the-mask" patterning. In particular embodiments, the electromagnetic radiation may be provided by a pulsed laser which could allow these methods to be ultrafast and suitable for continuous fabrication, while remaining simple, flexible, and direct.

Some embodiments include a method for preparing microscale polymer relief structures including providing a substrate coated with at least one polymer layer and exposing the substrate and the at least one polymer layer to electromagnetic radiation. In some embodiments, the substrate may absorb energy from at least a portion of the electromagnetic radiation, and heat may be generated as a result of the absorbed energy. At least a portion of the at least one polymer layer may be reorganized as a result of the heat generated, and microscale polymer relief structures may be produced as a result of the reorganization. Exposure of the substrate and the at least one polymer layer to electromagnetic radiation may be used as a non-ablative process without loss of material. In various embodiments, the substrate may include silicon, quartz, glass, indium tin oxide coated glass, a transparent conducting oxide, an absorbing polymer, or combinations thereof. The polymer layer may, generally, be substantially transparent to the electromagnetic radiation used. For example, in some embodiments, the at least one polymer layer may be polystyrene, polymethylmethacrylate, polyvinyl acetate, polyethylene, polypropylene, and combinations thereof.

In various embodiments, the thickness of each polymer layer may be about 10 nm to about 500 micrometers, more specifically, about 10 nm, about 20 nm, about 50 nm, about 100 nm, about 500 nm, about 800 nm, about 1 micrometer, about 5 micrometers, about 10 micrometers, about 20 micrometers, about 50 micrometers, about 75 micrometers, about 100 micrometers, about 250 micrometers, about 500 micrometers, and any value or range of values between any two of these values. In some embodiments, each polymer layer may be coated onto the substrate by any method. For example, non-limiting techniques for coating the substrate with a polymer layer may include surface-initiated polymerization, painting, pouring, spraying, dipping, evaporating, spin coating, pressing, contacting, and combinations thereof.

The power, or fluence, of the electromagnetic radiation may vary among embodiments. For example, in some embodiments, the fluence may be about 100 mJ per $cm^2$ to about 400 mJ per $cm^2$, and in other embodiments, the fluence about 250 mJ $cm^2$. Specific examples of fluence include about 100 mJ per $cm^2$, about 150 mJ per $cm^2$, about 200 mJ per $cm^2$, about 250 mJ per $cm^2$, about 300 mJ per $cm^2$, about 350 mJ per $cm^2$, about 400 mJ per $cm^2$, and any value or range of values between any two of these values. In particular embodiments, the power or fluence may be dependent on substrate selection, polymer type, polymer thickness, anticipated microscale polymer relief structure, or a combination thereof.

In certain embodiments, exposing the substrate and the at least one polymer layer to electromagnetic radiation may include irradiating the substrate and polymer layer with a laser, and the laser may have a fundamental emission wavelength. Non-limiting examples of the types of lasers that can be used in conjunction with the methods described herein include gas lasers, chemical lasers, dye lasers, metal-vapor lasers, solid-state lasers, and semiconductor lasers. In particular embodiments, the laser may be a neodymium-doped yttrium aluminum garnet laser. In some embodiments, the fundamental wavelength of an available laser may not be suitable and may be converted to a desired wavelength using known frequency conversion methods. Non-limiting examples of frequency conversion methods include passing the laser through at least one additional optic such as, for example, non-linear optics, optical parametric amplifiers, dichroic mirrors, diffraction gratings, collimators, convergent optics, divergent optics, and combinations thereof. In some embodiments, the fundamental wavelength of the laser may be converted to the second, third, fourth, or fifth harmonic of the fundamental wavelength.

The laser used in some embodiments may be a pulsed laser. In some embodiments, the pulsed laser may have a pulse width of about 1 femtosecond to about 1 microsecond, more specifically, 1 femtosecond, about 100 femtoseconds, about 250 femtoseconds, 500 femtoseconds, about 1 nanoseconds, about 5 nanoseconds, about 10 nanoseconds, about 15, nanoseconds, about 25 nanoseconds, about 50 nanoseconds, about 75 nanoseconds, about 100 nanoseconds, about 250 nanoseconds, about 500 nanoseconds, about 1 microsecond, and any value or range of values between any two of these values. In particular embodiments, the pulsed laser may have a pulse width of about 8 nanoseconds. In some embodiments, each irradiating step may occur when a single pulse from the pulsed laser irradiates the substrate, and in certain embodiments, a relief pattern may be produced with each pulse.

The desired wavelength, or energy, of the electromagnetic radiation may vary among embodiments and may be dependent on substrate selection, polymer type, polymer thickness, anticipated microscale polymer relief structure, periodic aperture, or a combination thereof. In some embodiments, the wavelength may be selected such that the substrate absorbs at least enough energy to be heated by the electromagnetic radiation, and the polymer layer may be substantially transparent to electromagnetic radiation at this wavelength. Specific examples of wavelength include about 100 nm, about 150 nm, 200 nm, about 250 nm, about 300 nm, about 350 nm, about 400 nm, about 600 nm, about 1000 nm, about 1,200 nm, about 1,500 nm, and any value or range of values between any two of these values. In particular embodiments, the electromagnetic radiation may be light having a wavelength of about 355 nm.

In various embodiments, exposing a substrate coated with at least one polymer layer to electromagnetic radiation may cause heating of the substrate and subsequent reorganizing of the polymer layer into polymer relief structures. In some embodiments, reorganizing the polymer layer may include melting at least a portion of each polymer layer and cooling the melted portion. In other embodiments, reorganizing the polymer layer may include plastic deformation of at least a portion of the each polymer layer.

The morphologies of the polymer relief structures may depend on substrate selection, polymer type, polymer thickness, periodic aperture, or a combination thereof. In some embodiments, the microscale polymer relief structures may resemble a wrinkle-like surface including a variety of dispersed polymer ridges with each ridge having a height, width, and length. As shown in FIG. 1, the space between -100 each polymer ridge and the width -110 of the polymer ridges may increase with the thickness of the polymer layer.

Various embodiments of methods for preparing microscale polymer relief structures may include providing a periodic aperture -200 separated by a distance -210 from the substrate coated with at least one polymer layer and passing electromagnetic radiation through the periodic aperture before exposing the substrate coated with at least one polymer layer to the electromagnetic radiation. In some embodiments, the periodic aperture may comprise a grid having components selected from squares, -220 rectangles, -230 hexagons, -240 or combinations thereof. Specific examples of grid components are circles, slits, squares, rectangles, crosses, overlapping circles, overlapping squares, overlapping rectangles, frames, rings, and half circles. In certain embodiments, the periodic aperture may be a transmission electron microscopy grid.

Figure 4:
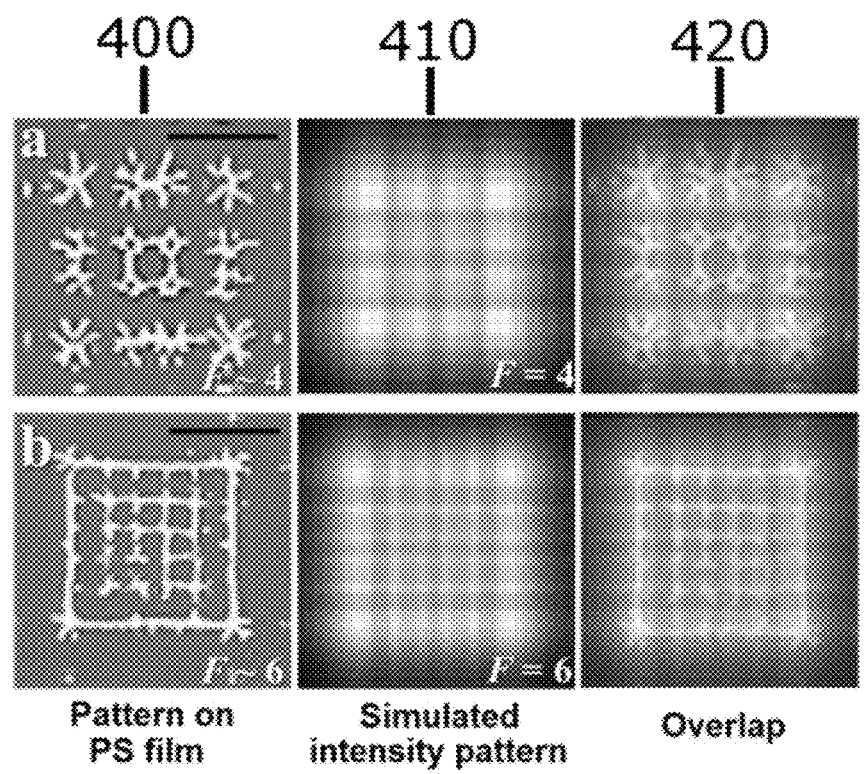
FIG. 4 provides exemplary optical images of experimentally generated patterns, simulated diffraction patterns, and overlays of the two patterns. Comparisons for F~4 (a) and F~6 (b) (Scale bars: 50 μm).

Passing the electromagnetic radiation through the periodic aperture may include creating a near-field diffraction pattern of electromagnetic radiation, and this near-filed diffraction pattern may have intensity maxima and intensity minima on the substrate. As shown in FIG. 4, the microscale polymer relief structures may include a periodic pattern having features -400 matching the intensity maxima of the near-field diffraction pattern -410. The similarities may be observed by overlaying -420 the relief structures with the simulated diffraction pattern. In these embodiments, the individual units of the periodic pattern may be about 22 percent to about 66 percent smaller than openings of the periodic aperture.

Figure 3:
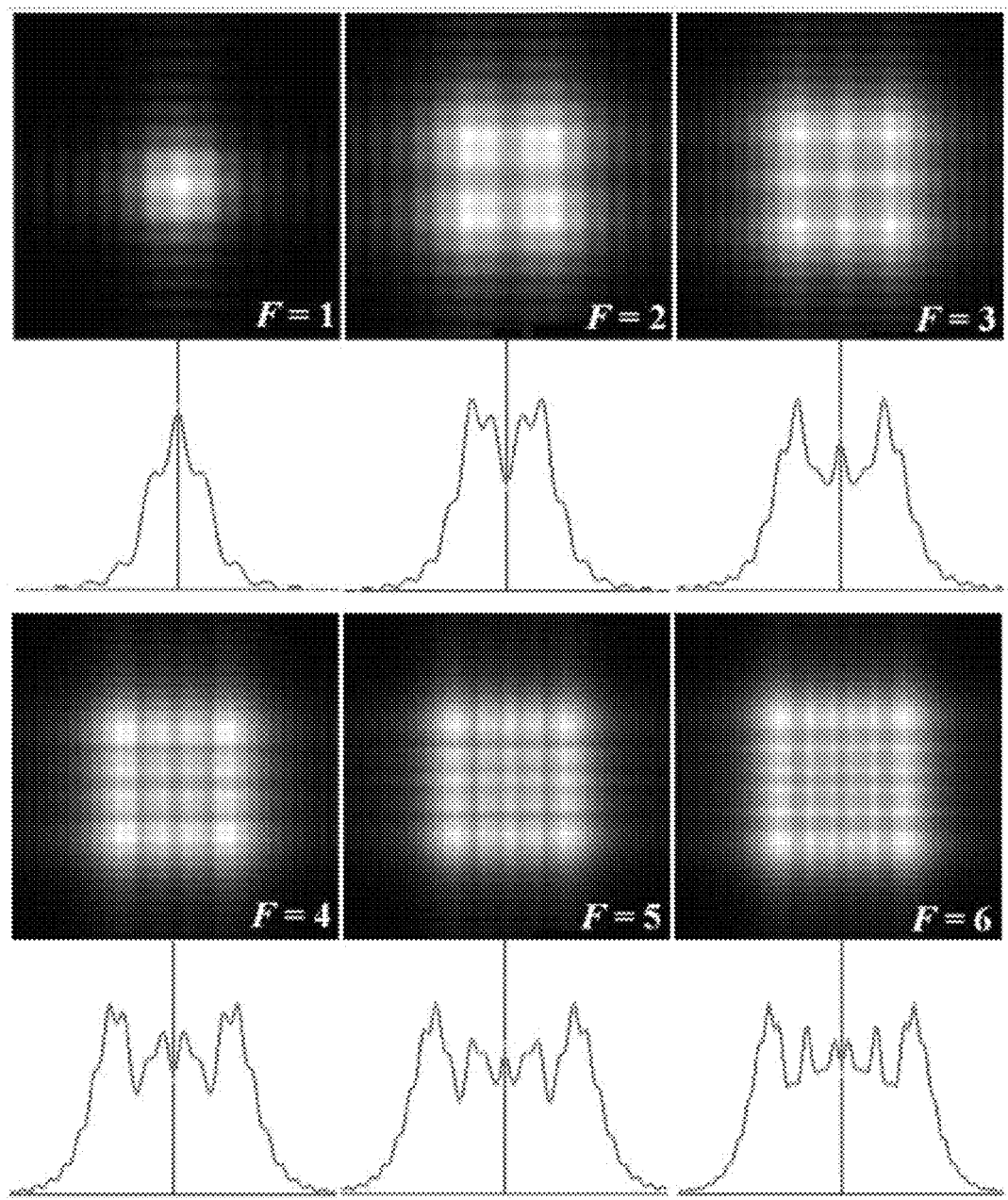
FIG. 3 is a graph showing simulated 2-dimensional Fresnel diffraction patterns and corresponding 1-dimensional intensity profiles for Fresnel numbers, 1 to 6.

The intensity maxima and minima of the diffraction pattern can be described using a Fresnel Number, F, defined as: $F = a^2/(\lambda * l)$, where a is half the aperture width, l is the distance of the aperture from the substrate, and $\lambda$ is the wavelength of the electromagnetic radiation. The Fresnel number can be varied by adjusting the distance of the periodic aperture from the substrate, and in some embodiments, changing the Fresnel Number can cause the diffraction pattern, and as such, the micro-relief structures, to change. FIG. 3 shows the effect various Fresnel Numbers have on the complexity and the intensity minima and maxima of simulated diffraction patterns using a square aperture.

Other embodiments include a device for preparing periodic microscale polymer relief structures. Such devices can include any number of components including, for example, a source of electromagnetic radiation, a periodic aperture arranged to allow electromagnetic radiation from the source of electromagnetic radiation to pass through the periodic aperture, and a stage configured and arranged to allow a substrate positioned on the stage to be separated by a distance from the periodic aperture and irradiated by electromagnetic radiation from the source after the electromagnetic radiation has passed through the periodic aperture.

In some embodiments, the source of electromagnetic radiation may be capable of producing light having a wavelength of about 355 nm with a fluence of about 100 to 400 mJ per cm$^2$, and the source of electromagnetic radiation may be a laser; wherein the properties of the laser, including laser type, pulse length, fluence, and wavelength, may be selected from those described previously. In further embodiments, the device may include one or more additional optical elements selected from non-linear optics, optical parametric amplifiers, dichroic mirrors, diffraction gratings, collimators, convergent optics, divergent optics, and combinations thereof.

The periodic aperture and the stage may be arranged to allow creation of a near-field diffraction pattern of electromagnetic radiation intensity maxima and minima on a substrate positioned on the stage. In some embodiments, the periodic aperture and the stage may be configured to allow the distance separating the periodic aperture from the substrate to be adjusted.

The periodic aperture of such embodiments may be a grid having individual components such as squares, rectangles, hexagons, or combinations thereof. Specific examples of grid components are circles, slits, squares, rectangles, crosses, overlapping circles, overlapping squares, overlapping rectangles, frames, rings, and half circles. In further embodiments, the periodic aperture may be removable from the device. In some embodiments, the periodic aperture may be a transmission electron microscopy grid.

In various embodiments, the substrates used in the device may be flexible or rigid. In some embodiments, a substrate supply reel for holding a non-irradiated substrate may be configured and arranged to allow the substrate to be transferred to the stage and to be irradiated with electromagnetic energy. In such embodiments, a substrate winding reel for holding irradiated substrate may be configured and arranged to collect the substrate from the stage after irradiation. In other embodiments, a substrate conveyor for supporting the substrate may be configured and arranged to transport the substrate through at least a portion of the device. Specific examples of conveyers include, but are not limited to, clamps, spindles, belts, trays, robotic arms, and combinations thereof. In some embodiments, the substrate conveyer may provide support for the substrate during irradiation and, thus, act as the stage. A separate stage may, therefore, be optional in such embodiments.

In some embodiments, the substrate may be coated with at least one polymer layer outside of the device. In other embodiments, a portion of the device may be configured to coat the substrate with at least one polymer layer. In such embodiments, the device may include at least one additional component for applying a polymer layer and the component may apply the polymer by, for example, painting, pouring, spraying, dipping, evaporating, spin coating, pressing, contacting, and combinations thereof. In some embodiments, the device may include a polymer supply reel for holding an unstructured polymer film, and the supply reel may be configured and arranged to allow the polymer film to contact the substrate while the substrate is irradiated with electromagnetic energy. In such embodiments, the device may further include a polymer winding reel for holding structured polymer film that is configured and arranged to collect the polymer film after contacting the substrate.

In some embodiments, the device may include the individual components for preparing periodic microscale polymer relief structures and may be self-contained. In other embodiments, a housing may operably connect the components of the device. For example, a housing may operably connect the source of electromagnetic radiation, the periodic aperture, the substrate, and any additional optional components. In other embodiments, at least one component of the device may be detached from the other components. For example, in particular embodiments, the source of electromagnetic radiation may be detached or detachable from a housing operably connecting the periodic aperture, the substrate, and any optional components.

EXAMPLES

Example 1

Polymer Layers on Silicon

Polystyrene ($M_n$=280,000) and polymethylmethacrylate ($M_n$=120,000) were spin coated onto thoroughly cleaned silicon wafer substrates to create polymer layers with thicknesses ranging from 30 nm to 400 nm using 0.5-5 w/v % polymer solutions in HPLC grade toluene.

Example 2

Optimization of Laser Fluence

The fundamental wavelength (1064 mm) from a neodymium-doped yttrium aluminum garnet nanosecond pulsed laser (Quanta-Ray® Lab, Spectra Physics, pulse width~8 ns) was converted to its third harmonic (355 nm), and used to irradiate the polymer layers from Example 1. The fluence was varied between 100-400 mJ cm$^{-2}$ and tuned to the onset of visible surface patterns and to avoiding film rupture, which was ~250 mJ cm$^{-2}$

Example 3

Effect of the Laser Beam on the Polymer Layer without Using an Aperture

Polymer layers from Example 1 were irradiated with a single laser pulse from the laser described in Example 2 set at ~250 mJ cm$^2$. Randomly distributed polymer ridges creating a wrinkle-like surface appeared on the films of both polystyrene and polymethylmethacrylate. The ridge line width ($w_C$) and the mean separation between the ridges ($L_C$) were both found to increase linearly with layer thickness. Relatively thick films (100 nm-400 nm) showed well developed, smooth, but sparse patterns. As the thickness decreased, the patterns became denser and more fragmented.

Example 4

Correlation of Polymer Relief Patterns and Simulated Diffraction Patterns

Patterned polymer relief structures were formed using 81 nm polystyrene layers on silicon from Example 1, a single laser pulse from the laser described in Example 2, an aperture with a grid of 110 μm square openings, and Fresnel Numbers (F) of 4 and 6. Optical images of the patterned polymer relief structures were overlaid with a simulated intensity pattern corresponding to the same F (FIG. 4). The polymer relief structures were found to form where the laser simulated intensity was higher.

Example 5

Effect of Polymer Thickness on Pattern Formation

Figure 5:
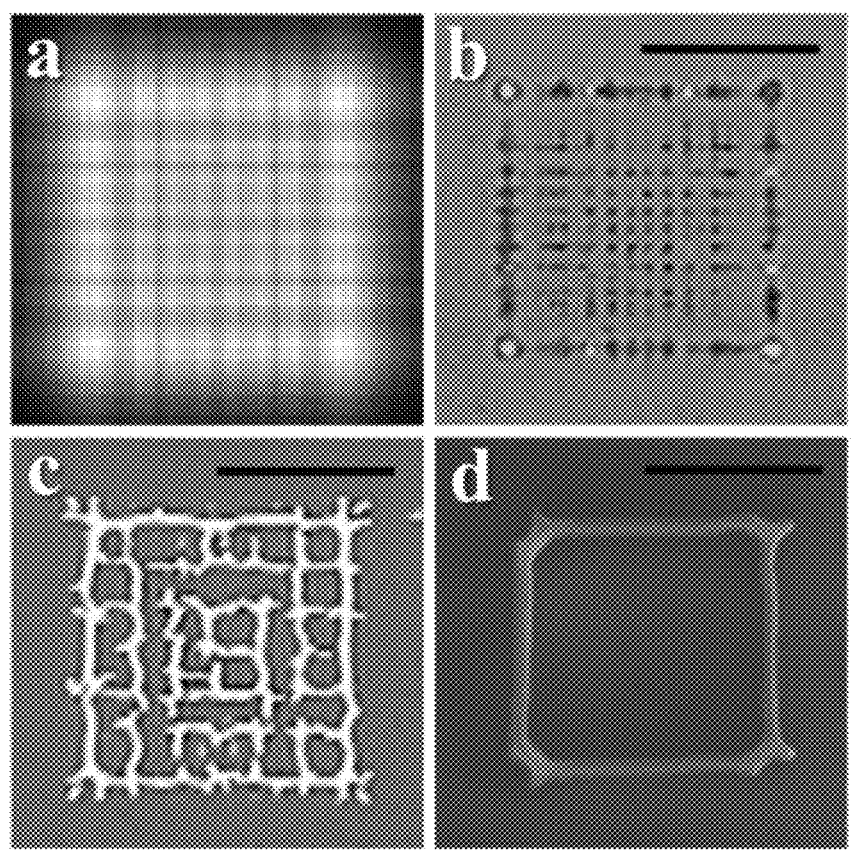
FIG. 5 shows a simulated diffraction pattern and optical images of experimentally generated patterns: (a) Simulated intensity distribution co-responding to F=8, and patterns formed on polystyrene films having a thickness of: (b) 39 nm, (c) 91 nm, and (d) 175 nm (Scale bars: 50 μm).

Patterned polymer relief structures were formed using 39 nm, 91 nm, and 175 nm polystyrene layers on silicon from Example 1, a single laser pulse from the laser described in Example 2, an aperture with a grid of 110 μm square openings, and a Fresnel Numbers (F) of 8. As shown in FIG. 5, the 39 min thick polymer layer made a pattern that was comparable to the simulated diffraction pattern, with the polymer pattern corresponding to each intensity maxima. Finer details started to disappear for the 91 nm thick layer, and only the gross pattern with a distorted interior was seen. Only the outer square pattern was observed for the 175 nm thick layer.

Example 6

Effect of F on Pattern Formation

Figure 6:
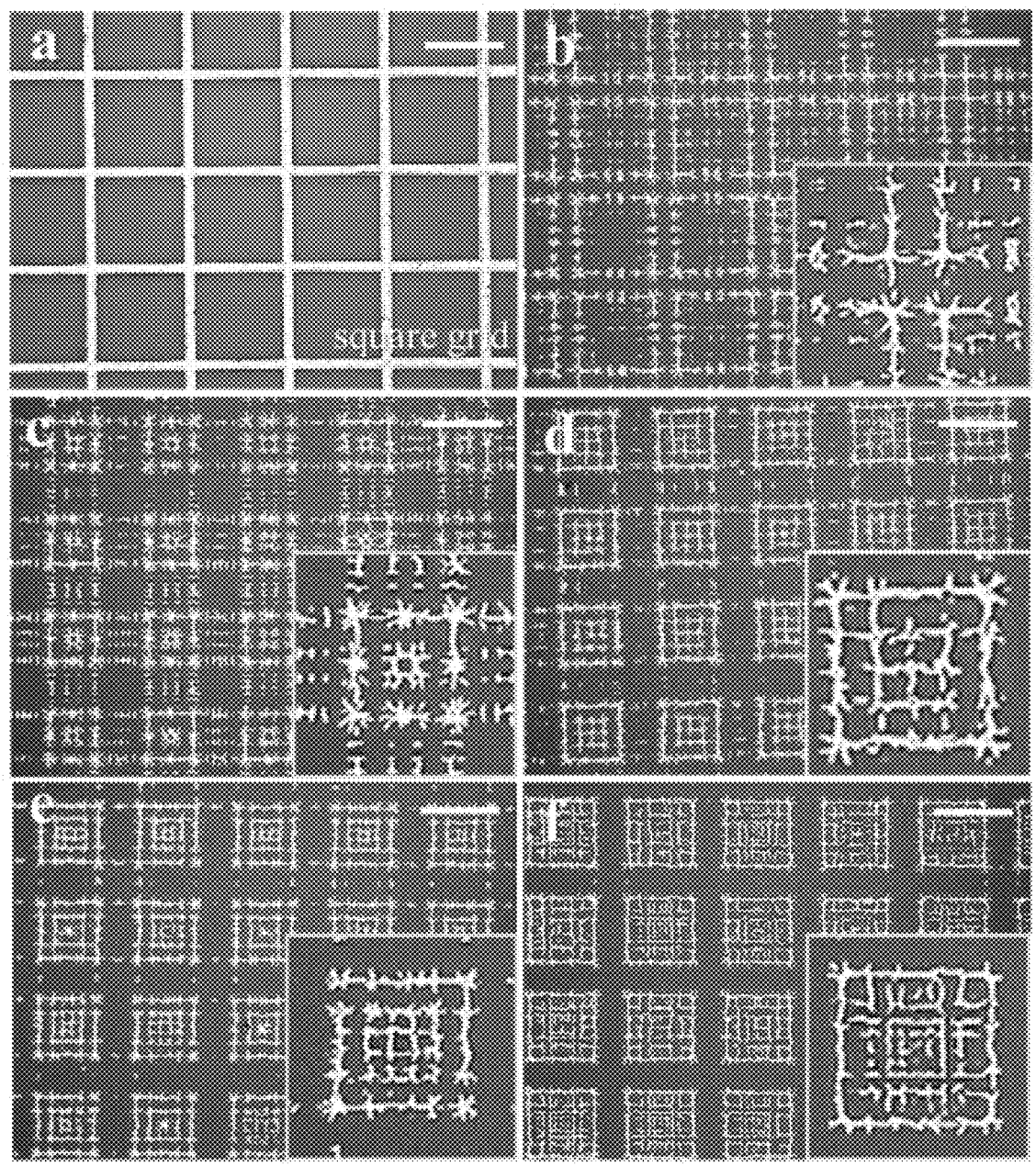
FIG. 6 provides exemplary optical micrographs of a periodic aperture and experimentally generated patterns: (a) the square-opening TEM grid used for patterning, and (b), (c), (d), (e) and (f) correspond to a patterned polystyrene layer of thickness 81 nm and different Fresnel number: F~2, 4, 5, 6, and 8, respectively. Insets show the enlarged unit-cell pattern formed within each aperture opening (Scale bar: 100 rpm).

Patterned polymer relief structures were formed using 81 nm polystyrene layers on silicon from Example 1, a single laser pulse from the laser described in Example 2, an aperture with a grid of 110 μm square openings, and Fresnel Numbers (F) of 2, 4, 5, 6 and 8. FIG. 6 shows that for relatively small values of F (F<4), the diffraction patterns of neighboring cells interfered to form a more continuous pattern, which resulted in less distinct boundaries of unit cells. Finer features appeared within a unit-cell pattern when F was large (F>5).

Example 7

Effect of Smaller Aperture on Pattern Formation

Figure 7:
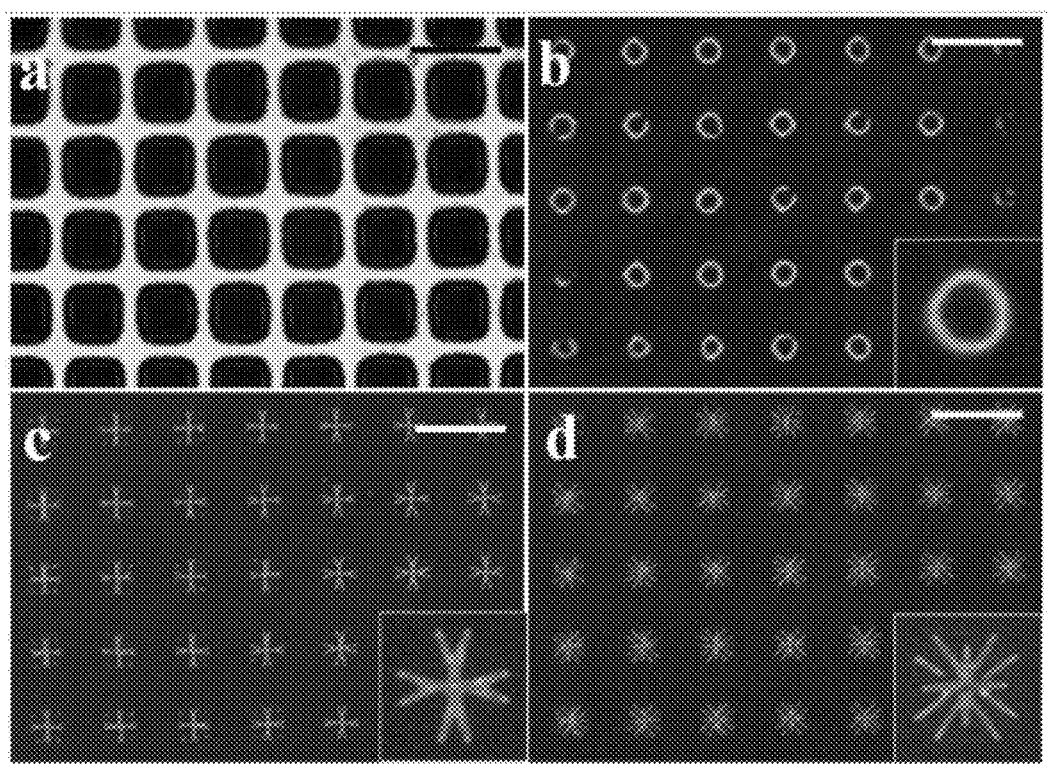
FIG. 7 provides exemplary optical micrographs of a periodic aperture and experimentally generated patterns: (a) a 400 mesh square opening TEM grid used for patterning, (b) patterned polymethylmethacrylate layer of thickness 98 nm for F~2, (c) patterned polymethylmethacrylate layer of thickness 78 nm F<1, and (d) patterned polymethylmethacrylate layer of thickness 78 nm F~2(Scale bar: 50 μm).

Patterned polymer relief structures were formed using 78 nm and 98 nm polymethylmethacrylate layers on silicon from Example 1, a single laser pulse from the laser described in Example 2, an aperture with a grid of 36 μm square openings, and Fresnel Numbers (F) of 1 and 2. FIG. 7 shows that the patterns formed using the 98 nm thick layer formed a ring-like pattern in each aperture opening; while the patterns formed using the 78 nm thick layer formed more complex star-shaped patterns.

Example 8

Effect of Hexagonal Grid Aperture on Pattern Formation

Figure 8:
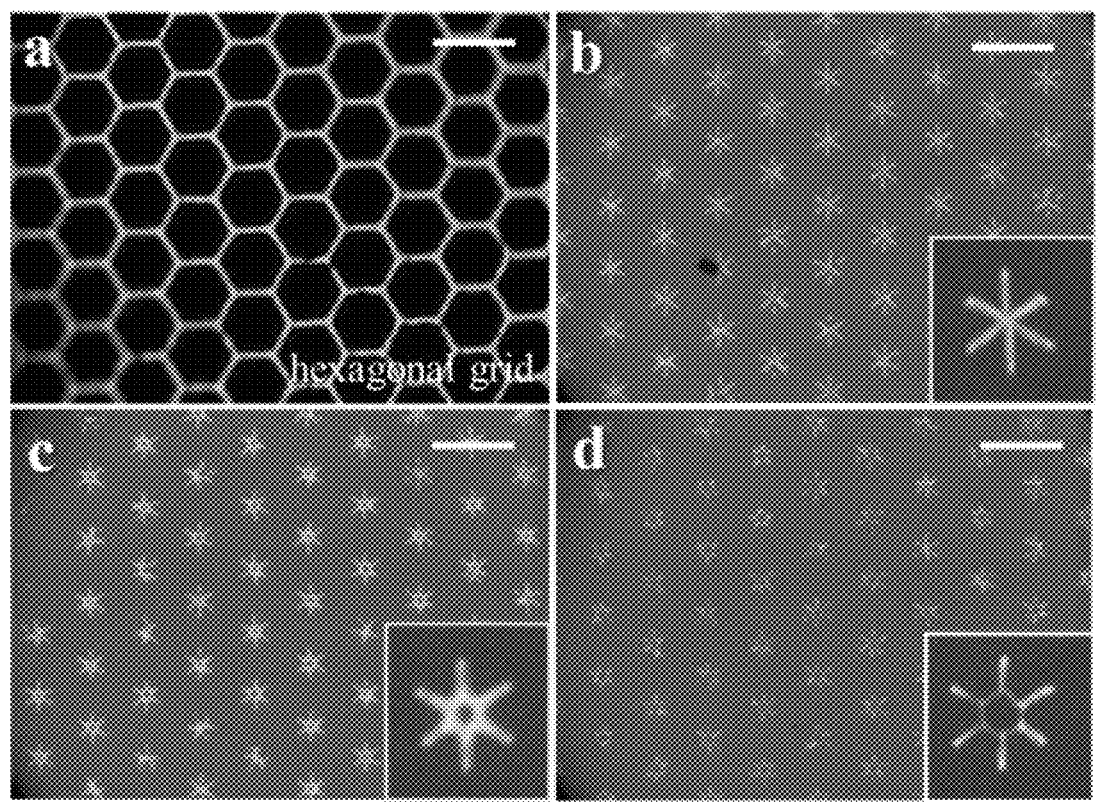
FIG. 8 provides exemplary optical micrographs of a periodic aperture and experimentally generated patterns: (a) a hexagonal opening TEM grid used for patterning, (b) F~9, (c) F~4, and (d) F~1 (Scale bar: 100 μm).
Figure 9:
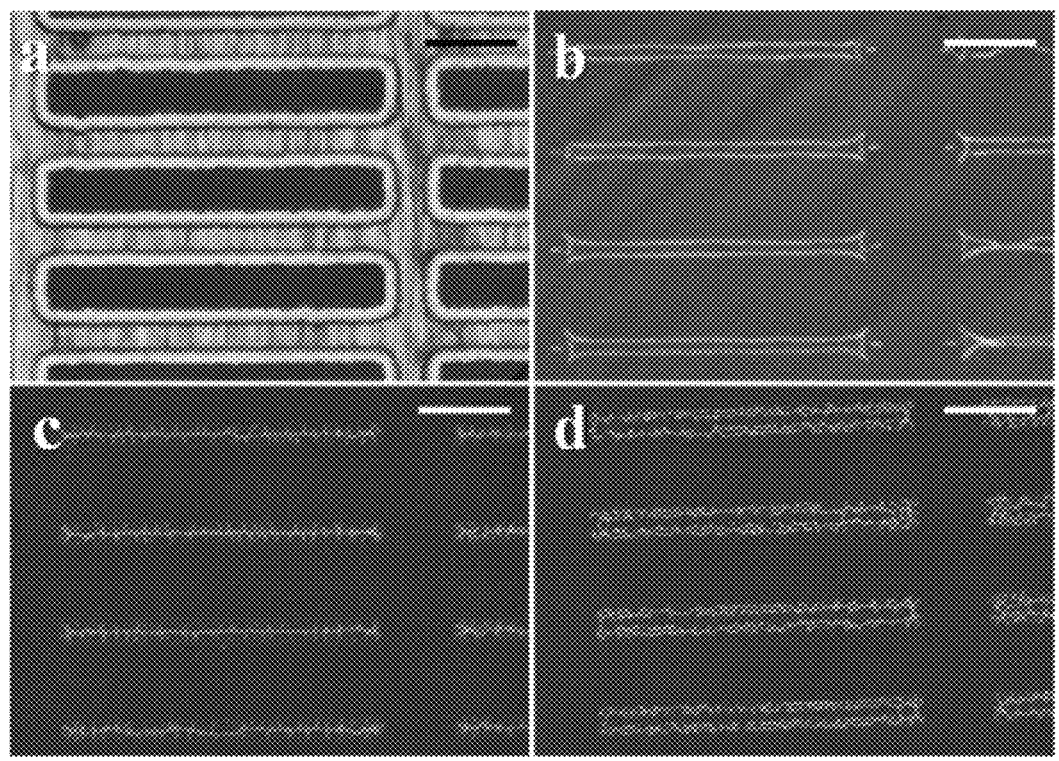
FIG. 9 provides exemplary optical micrographs of a periodic aperture and experimentally generated patterns: (a) a rectangular openings of the TEM grid used as a mask, (b) patterned polystyrene layer of thickness 138 nm with F~4, (c) patterned polystyrene layer of thickness 75 nm with F~1, and (d) patterned polystyrene layer of thickness 75 nm with F~2 (Scale bar: 50 μm).

Patterned polymer relief structures were formed using 98 nm polymethylmethacrylate layers on silicon from Example 1, a single laser pulse from the laser described in Example 2, an aperture with a grid of 55 μm hexagonal openings, and Fresnel Numbers (F) of 9, 4, and 1. FIG. 8, shows the resulting six-fold synthetic star-shaped patterns. The average size of the patterned unit-cells was about 36 μm, about 35% smaller than the mask opening, with a line width of about 2 μm.

Example 9

Effect of Rectangular Grid Aperture on Pattern Formation

Patterned polymer relief structures were formed using 138 nm and 75 nm polystyrene layers on silicon from Example 1, a single laser pulse from the laser described in Example 2, an aperture with a grid of 282 μm by 36 μm rectangular openings, and Fresnel Numbers (F) of 4, 2, and 1. FIG. 8, shows that arrays of polymers channels can be fabricated with controlled dimensions.

In the present disclosure, reference is made to the accompanying figures, which form a part hereof. The illustrative embodiments described in the detailed description, figure, and claims are not meant to be limiting. Other embodiments may be used, and other changes may be made, without departing from the spirit or scope of the subject matter presented herein. It will be readily understood that the aspects of the present disclosure, as generally described herein, and illustrated in the figure, may be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the fill scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or figure, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 substituents refers to groups having 1, 2, or 3 substituents. Similarly, a group having 1-5 substituents refers to groups having 1, 2, 3, 4, or 5 substituents, and so forth.

What is claimed is:

1. A method for preparing microscale polymer relief structures, the method comprising:
    providing a substrate coated with at least one polymer layer;
    exposing the substrate and the at least one polymer layer to electromagnetic radiation, the electromagnetic radiation having energy that is absorbed by the substrate;
    producing heat from the energy absorbed by the substrate;
    reorganizing the at least one polymer layer with the produced heat to prepare microscale polymer relief structures;
    providing a periodic aperture separated by a distance from the substrate coated with at least one polymer layer; and
    passing electromagnetic radiation through the periodic aperture before exposing the substrate coated with at least one polymer layer to the electromagnetic radiation, whereby a near-field diffraction pattern of electromagnetic radiation intensity maxima and minima is created on the substrate coated with at least one polymer layer.

2. The method of claim 1, wherein reorganizing the at least one polymer layer includes: melting at least a portion of the at least one polymer layer; and cooling the melted portion of the at least one polymer layer.

3. The method of claim 1, wherein reorganizing the at least one polymer layer includes plastic deformation of at least a portion of the at least one polymer layer.

4. The method of claim 1, wherein the at least one polymer layer is substantially transparent to the electromagnetic radiation.

5. The method of claim 1, wherein the at least one polymer layer comprises a polymer selected from the group consisting of polystyrene, polymethylmethacrylate, polyvinyl acetate, and combinations thereof.

6. The method of claim 1, wherein the substrate comprises silicon, quartz, glass, indium tin oxide coated glass, a transparent conducting oxide, or combinations thereof.

7. The method of claim 1, wherein the thickness of the at least one polymer layer is about 10 nm to about 500 micrometers.

8. The method of claim 1, wherein exposing the substrate to electromagnetic radiation comprises irradiating the substrate and the at least one polymer layer with a laser having a fundamental emission wavelength.

9. The method of claim 8, wherein the laser is a pulsed laser.

10. The method of claim 8, further comprising converting the fundamental wavelength of the laser to a second, third, fourth, or fifth harmonic.

11. The method of claim 1, wherein the electromagnetic radiation comprises light at about 355 nm.

12. The method of claim 1, wherein the electromagnetic radiation has a fluence of about 100 mJ per cm2 to 400 mJ per cm2.

13. The method of claim 1, further comprising adjusting the distance separating the periodic aperture from the substrate coated with at least one polymer layer.

14. The method of claim 1, wherein the periodic aperture comprises a grid having components selected from squares, rectangles, hexagons, or combinations thereof.

* * * * *

UNITED STATES PATENT AND TRADEMARK OFFICE
CERTIFICATE OF CORRECTION

PATENT NO.         : 8,545,945 B2  
APPLICATION NO.    : 13/359798  
DATED              : October 1, 2013  
INVENTOR(S)        : Sharma et al.

Page 1 of 1

It is certified that error appears in the above-identified patent and that said Letters Patent is hereby corrected as shown below:

In the Specification

In Column 2, Line 28, delete "co-responding" and insert -- corresponding --, therefor.

In Column 2, Line 37, delete "100 rpm)." and insert -- 100 μm). --, therefor.

In Column 7, Line 55, delete "39 min" and insert -- 39 nm --, therefor.

In Column 8, Line 33, delete "synthetic" and insert -- symmetric --, therefor.

In Column 9, Line 4, delete "fill" and insert -- full --, therefor.

In the Claims

In Column 11, Lines 4-5, in Claim 12, delete "cm2 to 400 mJ per cm2." and insert -- $cm^2$ to 400 mJ per $cm^2$. --, therefor.

Signed and Sealed this  
Eighth Day of April, 2014

Michelle K. Lee  
*Deputy Director of the United States Patent and Trademark Office*